United States Patent [19]

Nyman, Jr.

[11] Patent Number: 4,623,799
[45] Date of Patent: Nov. 18, 1986

[54] HIGH SPEED ANALOG/DIGITAL DRIVER

[75] Inventor: Phillip A. Nyman, Jr., Torrance, Calif.

[73] Assignee: TRW Inc., Redondo Beach, Calif.

[21] Appl. No.: 716,794

[22] Filed: Mar. 27, 1985

[51] Int. Cl.[4] .................. H03K 3/78; H03K 5/01; H03K 5/08

[52] U.S. Cl. .................................... 307/260; 307/261; 307/264; 307/268; 307/270; 307/473; 307/475

[58] Field of Search .............. 307/257, 260, 261, 264, 307/268, 270, 243, 473, 475, 317 A, 321

[56] References Cited

U.S. PATENT DOCUMENTS 3,098,214 7/1963 Windes et al. ................. 307/257
4,236,119 11/1980 Battjes ........................... 330/288
4,572,971 2/1986 Necoechea ....................... 307/260

OTHER PUBLICATIONS

U. Hübner et al., "A High-Speed Data Generator for Digital Testing" Hewlett-Packard Journal, Jul. 1983, pp. 7-14.

Primary Examiner—John Zazworsky
Attorney, Agent, or Firm—Peter L. Michaelson; Robert M. Wallace

[57] ABSTRACT

Apparatus for a driver, which handles both wideband analog and high speed digital signals through one common signal path into a low impedance load and is therefore particularly suited for use in automatic testing equipment (ATE), is described.

18 Claims, 8 Drawing Figures

HIGH SPEED ANALOG/DIGITAL DRIVER

BACKGROUND OF THE INVENTION

1. Field of the Invention

The invention relates to apparatus for a driver which handles wideband analog and high speed digital signals both through one common signal path into a low impedance load and is therefore particularly suited for use in automatic test equipment (ATE).

2. Description of the Prior Art

Automatic test equipment (ATE) is being increasingly used by electronic manufacturers to automatically test electronic assemblies. An ATE system generates a multitude of different electrical signals and selectively applies these signals in an appropriate pre-programmed sequence, as input, to a unit under test (UUT), and, in response thereto, accepts and analyzes a multitude of electrical output signals generated by the UUT. As a result, an ATE system helps locate faults in the UUT in a small fraction of the time that would otherwise be required by manual trouble-shooting.

In practice, an ATE system may employ a significant number of outputs and a like number of inputs (reaching perhaps to a total of 100 or more) for connection to a UUT. As such, any ATE must be configured for each different type of UUT. This necessitates that an appropriate interface driver must first be connected between the UUT and each input and each output of an ATE and then individually calibrated. Interface drivers can either be analog or digital, and serve as either input or output drivers. For example, if one input of a UUT requires a wideband analog signal, then a wideband analog output driver must be connected between a particular output of the ATE and that input of the UUT. Alternatively, if another input of the UUT requires a digital signal and particularly that of a specific logic family (e.g. emitter coupled logic - ECL), then a digital output driver appropriate to that logic family must be connected between an output of the ATE and that input of the UUT. Similarly, an appropriate input driver must be inserted between each output of the UUT and each corresponding input of the ATE. Moreover, all the interface drivers must be individually calibrated before an ATE system can be operated. In particular, each output driver must be calibrated to apply correct signal levels to the UUT. Likewise, each input driver must be calibrated to the maximum and minimum values of its associated UUT output signal. Thus, configuring an ATE often consumes an inordinate amount of time.

In an effort to reduce this amount of time, the art has taught that interface drivers should be general-purpose, and as such capable of being electrically configured to handle any one of a number of different signals. In particular, the maximum and minimum output signal levels of these general purpose drivers should be remotely and independently programmable through the application of suitable control voltages to the driver. In fact, if fully programmable, such a driver should be able to produce proper digital signal levels appropriate to any logic family. Furthermore, such a driver should also possess the ability to be remotely programmed to accept and amplify a wideband analog signal and then apply it to the UUT.

Although several general-purpose drivers appear in the art, all of these drivers suffer from one or more drawbacks. For example, many so-called general purpose drivers used in present ATE systems are slow digital drivers which employ an external relay to directly route an analog input signal to the output buffer stage of the driver. Furthermore, many of these drivers can not assume a high-impedance output state (for tri-sate operation) which is particularly useful in testing digital signal (e.g. data and/or address busses. Other drivers which have combined analog and digital capability utilize field effect transistor (FET) switches for switching between analog input signals and pre-defined digital logic levels. These drivers disadvantageously provide non-linear performance. In particular, as the amplitude of an input signal appearing across a FET increases, the "on" resistance of the FET also increases. At high amplitudes, this resistance becomes quite pronounced and as such generally imparts distortion to the analog input signal. Moreover, a FET switch does not contain an integral load buffer to isolate the output current from the input analog voltage. In most practical applications, a driver is working into a relatively low impedance load. Hence, these FET switches reflect the relatively low load impedance back to the analog input of the driver with the result that the analog input signal would be required to supply the entire load current -- thereby disadvantageously taxing the capability of the analog input circuitry.

Other prior art drivers which possess only a digital capability generally include a broadband power amplifier. Unfortunately, such an amplifier is complex and consumes an inordinate amount of power.

Hence, a need exists in the art for a driver which can handle wide bandwidth analog signals and high speed digital signals, all while driving a low impedance load, and can also selectively assume a high-impedance state.

SUMMARY OF THE INVENTION

An object of the present invention is to provide a general-purpose analog/digital driver which can handle both wide bandwidth analog and high speed digital signals.

A particular object is to provide such a driver which can be electrically programmed to select between a wideband input analog signal or a high speed digital input signal and route the selected signal through an output buffer to a common output port.

Another object is to provide such a driver which can be electrically programmed to generate digital output signal levels appropriate for any particular digital logic family.

A particular object is to provide such a driver which can be electrically programmed to independently adjust the magnitude of the maximum and minimum digital output logic levels.

Another object is to provide such a driver which selectively assume a high impedance output state and is thus suitable for tri-state operation.

Another object is to provide such a driver which provides linear performance under high amplitude input signal conditions and as such imparts no distortion to its output signal.

Another object is to provide such a driver which can work into a low impedance load while effectively isolating the load current from the input analog signal.

Lastly, another object is to provide a driver having low power consumption, by eliminating the need for a broadband amplifier, and which can thus be easily hybridized.

These and other objects are accomplished in accordance with the teachings of the present invention, by a driver which utilizes a group of input switching bridge which together are serially inter-connected to a second switching bridge that, in turn, provides an input signal to an output buffer. In particular, each analog input signal is connected to the input of a different high-speed input switching bridge. The outputs of all these input switching bridges are connected together to a common output point. At any one time, one of these input switching bridges is forward-biased, by a suitable bias current applied thereto, and the rest are reverse-biased. As a result, a desired analog input signal is routed through these input bridges and is applied to the common output point. This output point is connected to the input of the second switching bridge that, in turn, applies an input signal to a buffer. Whenever, a suitable bias current is applied to the second bridge, this bridge also becomes forward-biased and the analog input signal applied thereto is routed therethrough and applied as input to the buffer. From there, the buffer amplifies the analog input signal appearing at its input and applies the resulting amplified signal as the driver output. Alternatively, whenever the bias current is removed from the second bridge, this bridge becomes reverse-biased and non-conductive. In this case, the buffer also becomes reverse-biased, thereby causing a high-impedance to appear at the output of the buffer.

The inventive driver has both analog signal and digital "data" inputs. Advantageously, this driver can be configured, through the application of various remote programming voltages, either to generate high-speed digital logic signals at appropriate levels for any logic family and apply these signals to the output of the driver, or to route a selected wide bandwidth analog input signal to the same output. Specifically, if a different static voltage level particular to a logic family is applied to each of two analog signal inputs of the driver, then the output of the driver will switch between these two different voltage levels in accordance with a dynamically changing digital signal applied to the digital "data" input of the driver. Alternatively, if a different dynamically varying analog signal is applied to each of the two analog signal inputs, then a suitable static digital level can be applied to the digital "data" input to select which analog signal is to appear at the output of the driver at any one time.

In accordance with a feature of the present invention, the transition time of the output signal produced by the driver can be set to prevent the driver output signal from ringing. In particular, the driver has a "transition time control input" to which an analog control voltage can be applied. The magnitude of this control voltage determines the amount of switching current available to charge various circuit capacitances in the driver which, in turn, sets the switching speed of the driver.

DESCRIPTION OF THE DRAWING

A complete understanding of the teachings of the present invention may be obtained by considering the following detailed description in conjunction with the accompanying drawing, in which:

FIGS. 6–8 provide a schematic of the inventive driver shown in block form in both FIGS. 3 and 4.

To facilitate reader understanding, identical reference numerals have been used to designate identical elements common to two or more of the figures.

DETAILED DESCRIPTION

Various drivers have been proposed in the art for use in automatic test equipment (ATE) systems. However, all these prior art drivers possess drawbacks of one form or another which limit their utility for use in ATE applications. Two such illustrative prior art drivers are shown in FIGS. 1 and 2.

Figure 1:
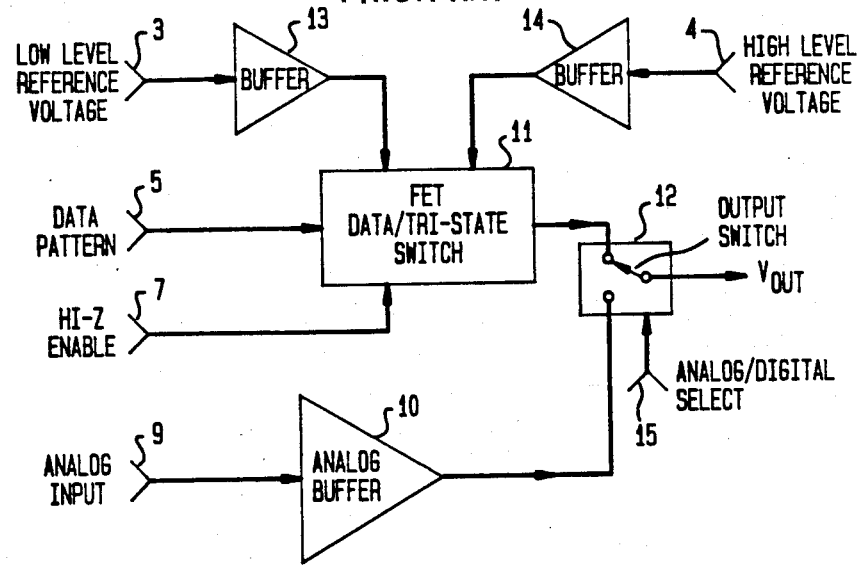
FIG. 1 depicts a block diagram of a combined analog/digital driver typical of those known in the art.

In particular, FIG. 1 depicts a block diagram of a prior art driver which is capable of handling both analog and digital signals. Here, two different fixed reference voltage levels, corresponding to the "zero" and "one" logic levels of a desired logic family, are applied, via inputs 3 and 4, to buffers 13 and 14, respectively. In response to a digital control signal appearing at data pattern input 5, data/tristate switch 11 selects either of these two reference voltages and applies it as input to output switch 12. Switch 11 employs field effect transistors (FETs) as the switching element. Output switch 12 is usually a relay or a field effect transistor (FET) switch. An analog input signal is applied, via analog input 9, to analog buffer 10. This buffer amplifies this analog signal and routes the resulting signal to another input of switch 12. Switch 12, in response to the level of an appropriate control signal applied to analog/digital select input 15, selects either the digital signal provided by switch 11 or the analog signal provided by buffer 10 as the driver output signal, Vout. Whenever, switch 12 is instructed to apply a digital signal to its output, this output can be made to assume a high-impedance (HI-Z) state by application of a suitable control voltage to HI-Z enable input 7. These drivers possess three severe drawbacks. First, since most driven loads in ATE applications are relatively low impedance and switch 11 does not generally contain an integral load buffer, the low load impedance is reflected through the FETs used in switch 11 back to analog buffers 13 and 14. This imposes significant load current demands on these buffers. Therefore, additional load buffer circuitry must be disadvantageously added to the switch inputs for the high and low level reference voltages. Second, in these drivers, the "on" resistance of a FET changes with the amplitude of the signal applied across the FET. Consequently, for large amplitude signals, the "on" resistance significantly increases thereby injecting significant distortion into the driver output signal, Vout. Third, these drivers are quite slow.

Figure 2:
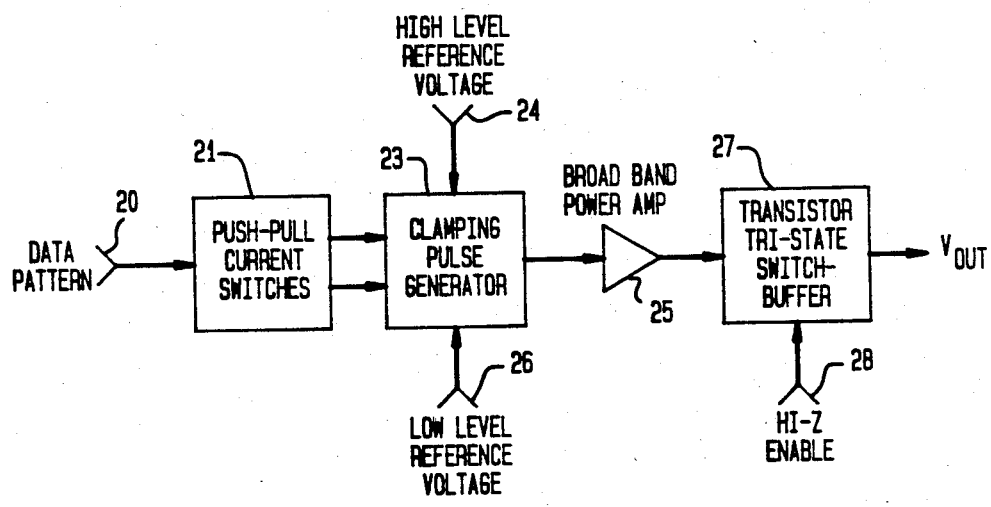
FIG. 2 depicts a block diagram of a digital driver typical of those known in the art.

FIG. 2 illustratively shows a block diagram of a digital driver well known to the art. Here, the driver, in response to a digital control signal applied to "data pattern" input 20 feeding push-pull current switches 21, selects either one of two fixed reference voltages which together are applied, via inputs 24 and 26, as input to clamping pulse generator 23. This generator is generally a switch implemented with operational amplifiers. The selected reference voltage is then amplified by broadband power amplifier 25 and applied, via transistor tri-state switch buffer 27, as the driver output signal, Vout. An appropriate control signal applied to HI-Z enable input 28 over-rides the output of amplifier 25 and causes the output of the driver to assume a high impedance state. Although drivers of this type perform reasonably well for relatively slow digital signals, propagation delay around an internal feedback loop (not shown) in broadband amplifier 25 disadvantageously limits the speed of the digital signal which this driver can handle. Moreover, these drivers completely lack the capability to handle analog signals. In addition, broadband amplifier 25 tends to be rather complex and also requires an inordinate amount of power. Inclusion of such an amplifier within a driver substantially increases the amount of heat that the driver must dissipate. This, in turn, generally prohibits the driver from being miniaturized, particularly through hybridization, into a small package. Hence, for these reasons, drivers of the type shown in FIGS. 1 and 2 are not well suited for use in ATE applications.

The previously discussed drawbacks inherent in prior art drivers are advantageously eliminated in the high speed analog-digital driver shown in FIGS. 3-8 which embodies the teachings of the present invention.

Figure 3:
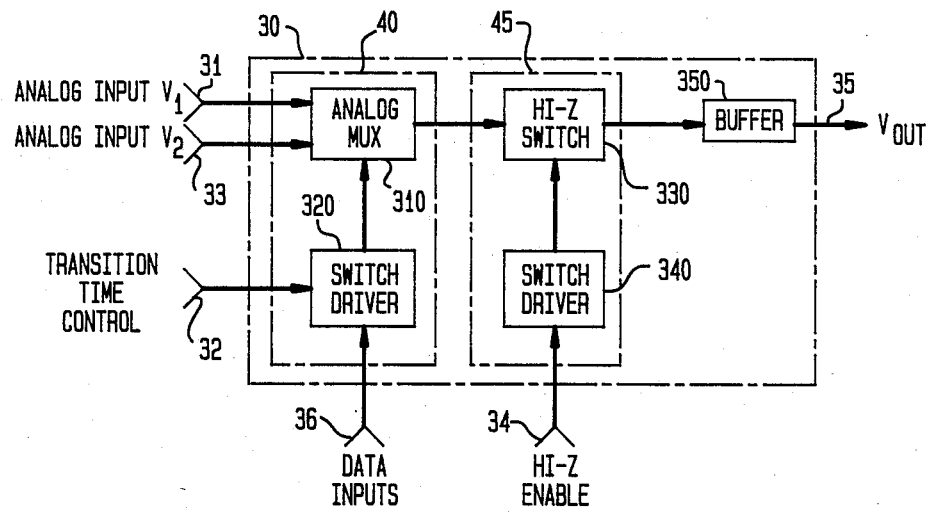
FIG. 3 shows a simplified block diagram of a analog/digital driver embodying the teachings of the present invention.

In particular, FIG. 3 depicts a simplified block diagram of inventive driver 30. Here, driver 30 contains linear, two input, dynamically controlled analog multiplexor 310 connected through a high impedance switch 330 to linear, high speed output buffer 350. Switch driver 320, in response to a digital signal applied to data input 36, drives multiplexor 310 to select a desired one of two analog input voltages V1 or V2, applied to input 31 or 33, respectively, and then apply the selected voltage as an input to HI-Z switch 330. This switch routes the selected analog voltage to the input of buffer 350 which amplifies this voltage and thereafter applies it to output 35 as driver output voltage, Vout. Buffer 350 isolates the current drawn by any load connected to the output of the driver from all the analog inputs. As discussed in greater detail below, an appropriate control voltage applied to HI-Z enable input 34 of switch driver 340 causes both HI-Z switch 330 and buffer 350 to become reverse-biased (non-conductive). This, in turn, permits output 35 of driver 30 to assume a high impedance state, independent of the values of the analog input signals, and thereby produce tri-state operation.

The amount of time required for analog multiplexor 310 to switch between its two inputs (e.g. from level V1 applied to analog input 31 to level V2 applied to analog input 33) is programmable via an analog control voltage applied to transition time control input 32. As discussed in greater detail below, the magnitude of this analog control voltage determines the amount of switching current available to switch the states of analog multiplexor 310. As the amount of switching current increases, the multiplexor is able to switch between its inputs in correspondingly shorter times. Whenever the driver is connected to a specific load, this control voltage is set to a value sufficient to prevent the driver output signal appearing across the load from ringing. When used as output drivers in ATE applications, the analog inputs to the driver are typically provided through digital-to-analog converters connected to digital processing circuitry (e.g. industrial controllers, computers or the like) comprising the ATE system. As discussed below, all input signal switching may be done either statically or dynamically.

The inventive driver may be used in the three different modes. First, in the digital mode, driver 30 can produce a digital data pattern. This digital output pattern will switch between two static voltage levels, V1 and V2, applied to analog inputs 31 and 33, in response to digital data appearing at data input 36. An analog control voltage applied to transition time control input 32 will determine the speed at which the digital signal appearing at output 35 will switch states. Second, in the analog mode, driver 30 can select, in response to a static digital level applied to data input 36, one of two varying analog input signals, applied to its analog inputs, amplify the selected input signal and thereafter apply the result to the driver output. Lastly, the driver can operate in the high impedance mode. Here, in response to a digital level applied to HI-Z enable input 34, both HI-Z switch 330 and buffer 350 will become non-conductive and hence the output of the driver will assume a high impedance state independent of the input signals applied to analog inputs 31 and 33 and to digital data input 36. In particular, each mode of operation is illustratively envoked as set forth below:

a. digital mode
First, the desired analog output levels for any digital logic family are applied as input analog voltages V1 and V2 to inputs 31 and 33, respectively. Second, a suitable control voltage is applied to input 32 to set the desired transition time of the driver output signal.
Next, a suitable control voltage (e.g. a low digital logic level) is applied to HI-Z enable input 34 to permit HI-Z switch 330 to become forward biased and thereby permit buffer 350 to become active and thus switch between input signal levels V1 and V2.
Lastly, the desired digital output data pattern is then serially applied to data input 36 to cause the multiplexor to dynamically switch between the analog input signals V1 and V2 in accordance with the digital data pattern applied to input 36.

b. analog mode
First, the desired analog input signals, V1 and V2, are applied to inputs 31 and/or 33.
Next, a suitable control voltage (e.g. a low digital logic level) is applied to HI-Z enable input 34 to permit HI-Z switch 330 to become forward biased and thereby permit buffer 350 to become active.
Third, an appropriate logic level (either high or low) is applied to input 36 to statically select the desired one of analog input signals, V1 or V2, and to apply that signal through HI-Z switch 330 to the input to buffer 350 which, in turn, amplifies that signal and applies it to output 35.

c. HI-Z mode
An appropriate logic level (e.g. a high logic level) is applied to HI-Z input 34 to cause output 35 to assume a high-impedance state.

If different analog signals are applied to both inputs 31 and 33 and simultaneously therewith the data patterns applied to input 36 are dynamically changed in any one of many appropriate fashions, then the inventive driver is able to generate one of many different types of modulated analog signals.

Figure 4:
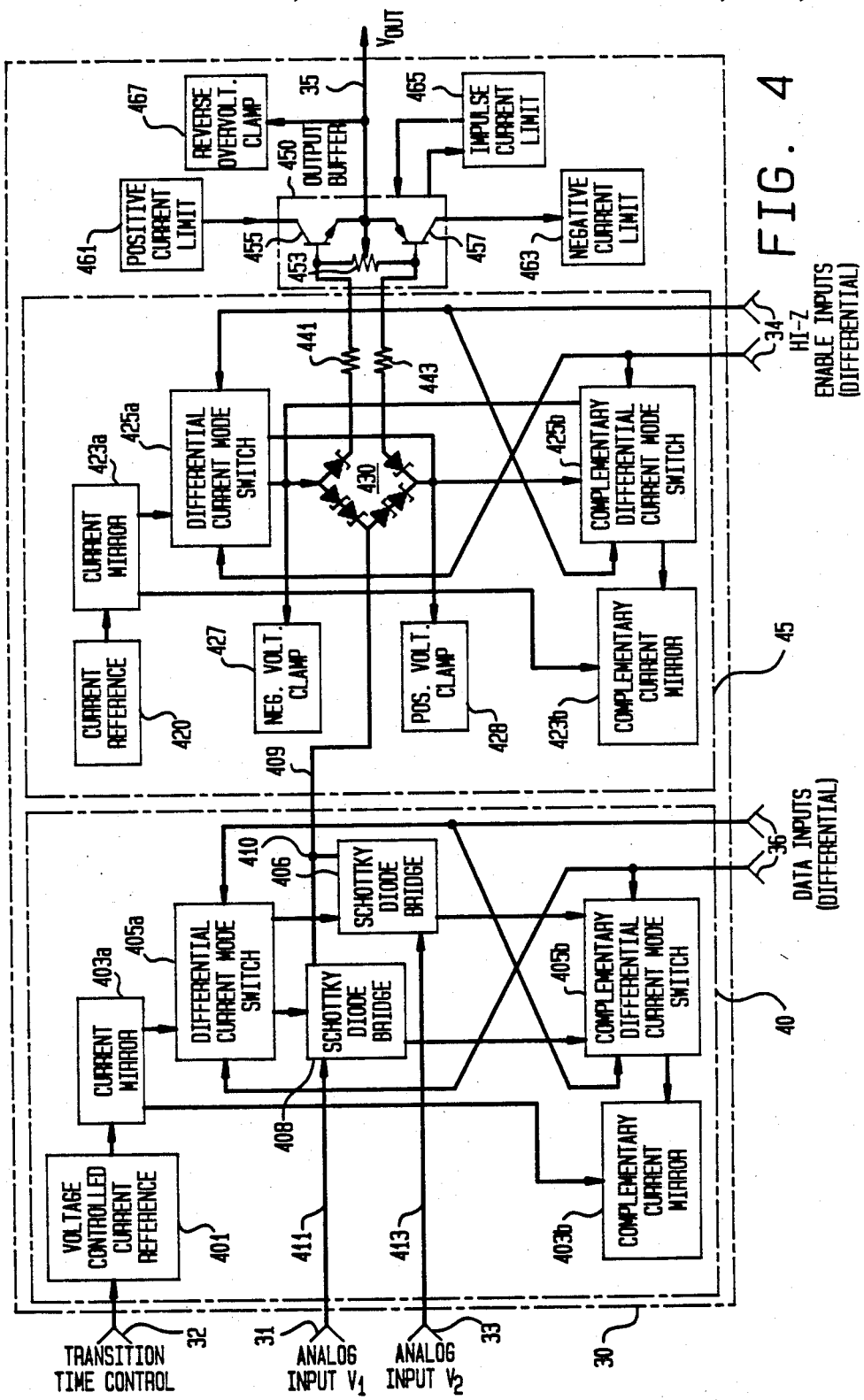
FIG. 4 shows a detailed block diagram of the inventive driver shown in FIG. 3.
Figure 6:
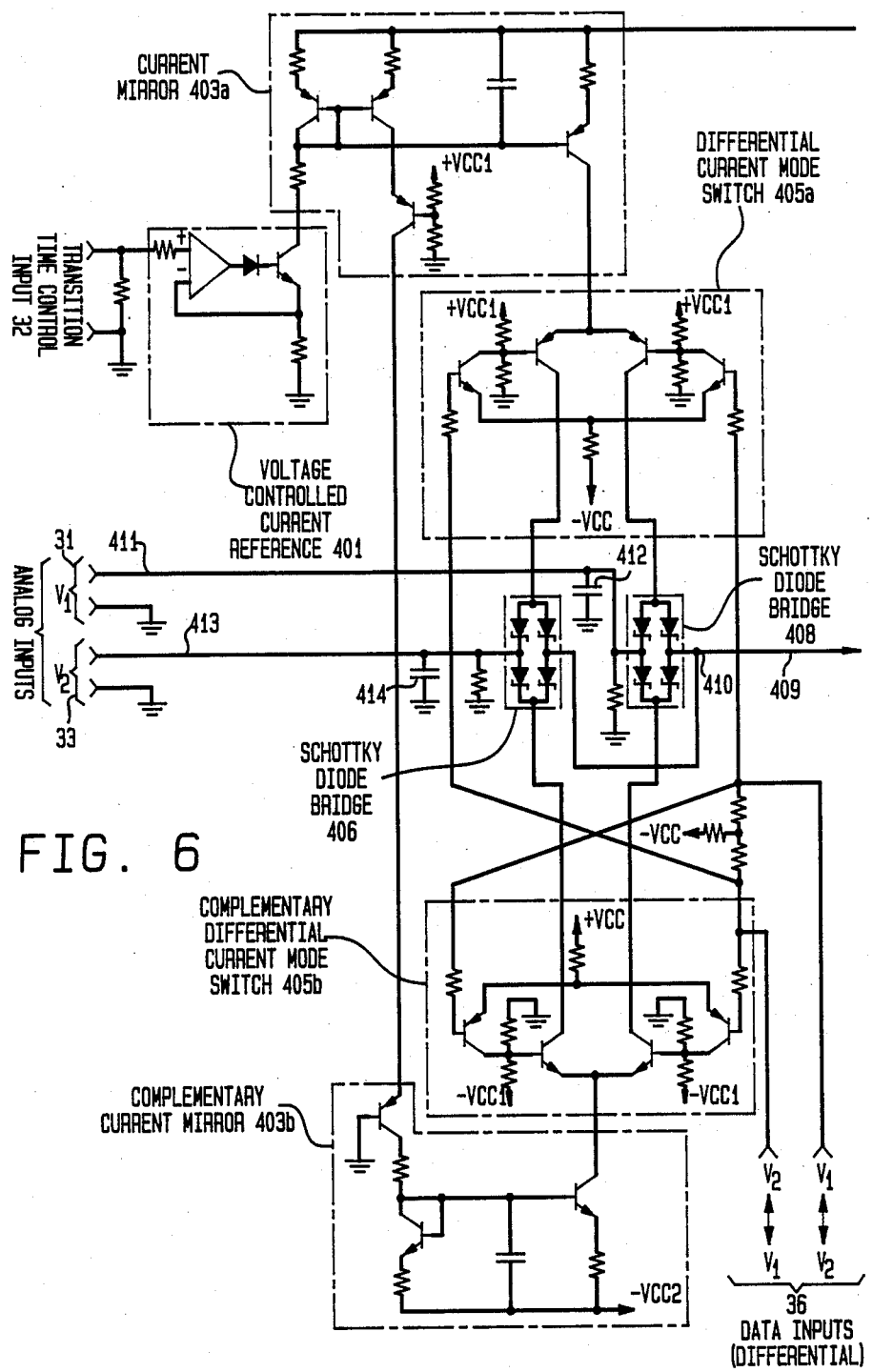

A detailed block diagram of the inventive driver, depicted in FIG. 3, is shown in FIG. 4. Analog multiplexor 310 is comprised of Schottky diode bridges 406 and 408 configured together as a single pole, two position switch. Analog input voltage V1 is applied, via input 31 and lead 411, to the input of Schottky diode bridge 408 (specifically the left or input node of this bridge as shown in FIG. 6). Analog input voltage V2 is applied, via input 33 and lead 413, to the input of Schottky diode bridge 406. The switch position is controlled by injected forward bias current through a selected Schottky bridge (through the switching nodes, i.e. the top and bottom nodes in either Schottky diode bridge 406 or 408 as shown in FIG. 6) while injecting no forward bias current through the remaining bridge.

Each of the input bridges are implemented using balanced Schottky diodes which advantageously provide high speed switching, low analog distortion and small switch offset voltages. In addition, a full bridge configuration is used for each of the input bridges inasmuch as this configuration greatly reduces the amount of switching signal transferred into the analog signal path. Specifically, balanced currents in each leg of the bridge result in no net switching current injected into the signal path.

Switch driver 320, shown in FIG. 3, is comprised of a complementary pair of fully differentially driven current mode switches, i.e. switches 405a and 405b. These current mode switches possess the ability to switch forward bias current between Schottky diode bridges 406 and 408 very precisely and very quickly. In fact, these switches route all of the available bias current to one bridge and leave almost no bias current for the second bridge. Current mode switches 405a and 405b are configured in a complementary fashion such that the bias current entering both Schottky diode bridges equals the current leaving both bridges. As a result, signal distortion, offset voltages and switching noise are all advantageously reduced. Moreover, the data input to the current mode switches, applied via input 36, are provided in fully differential form which advantageously provides maximum switching speed between the analog inputs while minimizing any time jitter in the generated data appearing at output 35 of the driver. The output from Schottky diode bridges 406 and 408 (appearing at the right or output nodes of these bridges as shown in FIG. 6) are connected together to a common point, i.e. junction 410, and from there to lead 409.

Current mirrors 403a and 403b insure that the current entering differential current mode switch 405a and that leaving complementary differential current mode switch 405b are always equal. In addition, both current mirrors provide temperature compensation of the current sources in a well-known fashion (i.e. by inter-connecting the base and collector of a transistor in each current mirror, e.g. the transistor in the upper left corner of current mirror 403a shown in FIG. 6). Furthermore, current mirrors 403a and 403b allow the slew rate of the switching current applied to Schottky bridges 406 and 408 to be determined by a reference current generated by voltage controlled current reference 401. In particular, the magnitude of a low power analog control voltage applied to transition time control input 32 determines the magnitude of the switching current generated by current mirrors 403a and 403b and hence available to charge various circuit capacitances, e.g. stray wiring capacitances and the like. This, in turn, determines their charging time, and hence sets the time required by current mode switches 405a and 405b to route bias current from the one Schottky diode bridge (406 or 408) that is conducting to the other. As a result, this determines the speed at which the analog multiplexor can switch between its two analog inputs and thus sets the transition time (switching speed) of the generated digital data appearing at output 35 of the driver. In actual use, as noted, the transition time is preferably set to a value sufficient to prevent driver output voltage Vout, which appears across a load (not shown) connected to output 35, from ringing.

Analog multiplexor 310 and switch driver 320 (see FIG. 3) which together comprise circuit 40 are able to generate analog and digital signals. However, practical ATE applications often require driving these signals into relatively low impedance loads. If the output of circuit 40, appearing on lead 409 (see FIG. 4) were to be directly applied to a low impedance load, then this low impedance would be reflected back through whatever Schottky bridge, 406 or 408, that happens to be conducting, to the analog input 31 or 33, respectively. Consequently, that analog input would be required to supply the entire load current. Furthermore, the Schottky bridge switching current would necessarily become larger than the load current. This would result in a poorly balanced bridge and significantly increased power consumption occurring in the current mode switches and the current mirrors. To prevent this unwanted result, a practical analog multiplexor must be isolated from the load applied to the buffer.

Similarly, Schottky diode bridge 430, which is used in high impedance switch 330 (shown in FIG. 3) must also be isolated from the load to ensure that this bridge always remains properly balanced. Serially interconnecting analog multiplexor 310 and high impedance switch 330 allows all three Schottky diode bridges 406, 408 and 430 to use one load isolation buffer, i.e. buffer 450. Such a configuration minimizes bridge currents and thus advantageously results in greatly reduced power consumption. Furthermore, this configuration also advantageously reduces component count. Moreover, by locating all three bridge in close proximity to each other, stray wiring capacitances are advantageously reduced and switching speed of these bridges is significantly increased.

Specifically, as shown in FIG. 3, circuit 45 contains HI-Z switch 330 and switch driver 340. As depicted in detail in FIG. 4, the high impedance switch contains bridge 430. Series resistors 441 and 443 and base to emitter junctions of output transistors 455 and 457 have been placed in series with the Schottky diodes comprising two legs of this bridge. Potentiometer 453, connected between the bases of transistors 455 and 457 and driver output 35, is appropriately adjusted to null out any output offset voltage produced by bridge 430. This bridge is operated by switch driver 340 (see FIG. 3) which contains a complementary pair of fully differentially driven current mode switches 425a and 425b. These current mode switches -- identical to switches 405a and 405b described above and used in switch driver 320 -- switch forward bias current very precisely and very quickly between either bridge 430 or positive and negative voltage clamps 427 and 428. As shown, current mode switches 425a and 425b are configured in a complementary fashion. Furthermore, as with switch driver 320, using fully differential inputs to current mode switches 425a and 425b provides maximum switching speed in bridge 430 while minimizing any time jitter in the generated data appearing at output 35 of the driver.

Current mode switches 425a and 425b are driven by current mirror 423a and complementary current mirror 423b, respectively. These current mirrors are essentially similar to current mirror 403a and complementary current mirror 403b used in switch driver 320, with the difference being that a fixed reference current source 420 is used instead of voltage controlled current source 401. The value of the fixed reference current is set to provide the fastest switching time for bridge 430 and thereby minimize the transition times in the data appearing at output 35 of the driver. Clearly, if desired, a voltage controlled current source could be alternatively used in place of fixed current reference 420 to permit the switching time of HI-Z switch 330 to be remotely programmed. However, inasmuch as the amount of switching current flowing through HI-Z switch bridge 430 affects the amount of quiescent current flowing in output buffer 450, the useful range of switching current for bridge 430, which is obtained by employing a voltage controlled current reference in lieu of fixed current reference 420, is more limited than that obtained for analog multiplexor 310 through use of voltage controlled current reference 401.

All the legs of bridge 430 are initially balanced such that an equal voltage drop appears across each leg and the resulting voltage between the bases of transistors 455 and 457 provides equal amounts of quiescent collector current in both transistors. The particular amount of quiescent current is that required to minimize both power dissipation and crossover distortion occurring in these transistors. This balancing is accomplished by matching all the Schottky diodes comprising the bridge and by selecting appropriate values for resistors 441 and 443.

Hence, whenever inventive driver 30 is operated in either the analog or digital driver modes, all the Schottky diodes and base to emitter junctions comprising bridge 430 are forward biased by a constant current from current mode switches 425a and 425b. Consequently, the signal appearing on lead 409, which is applied to the left or input node of bridge 430, appears at the output of the bridge and is thus fed to buffer 450.

Figure 7:
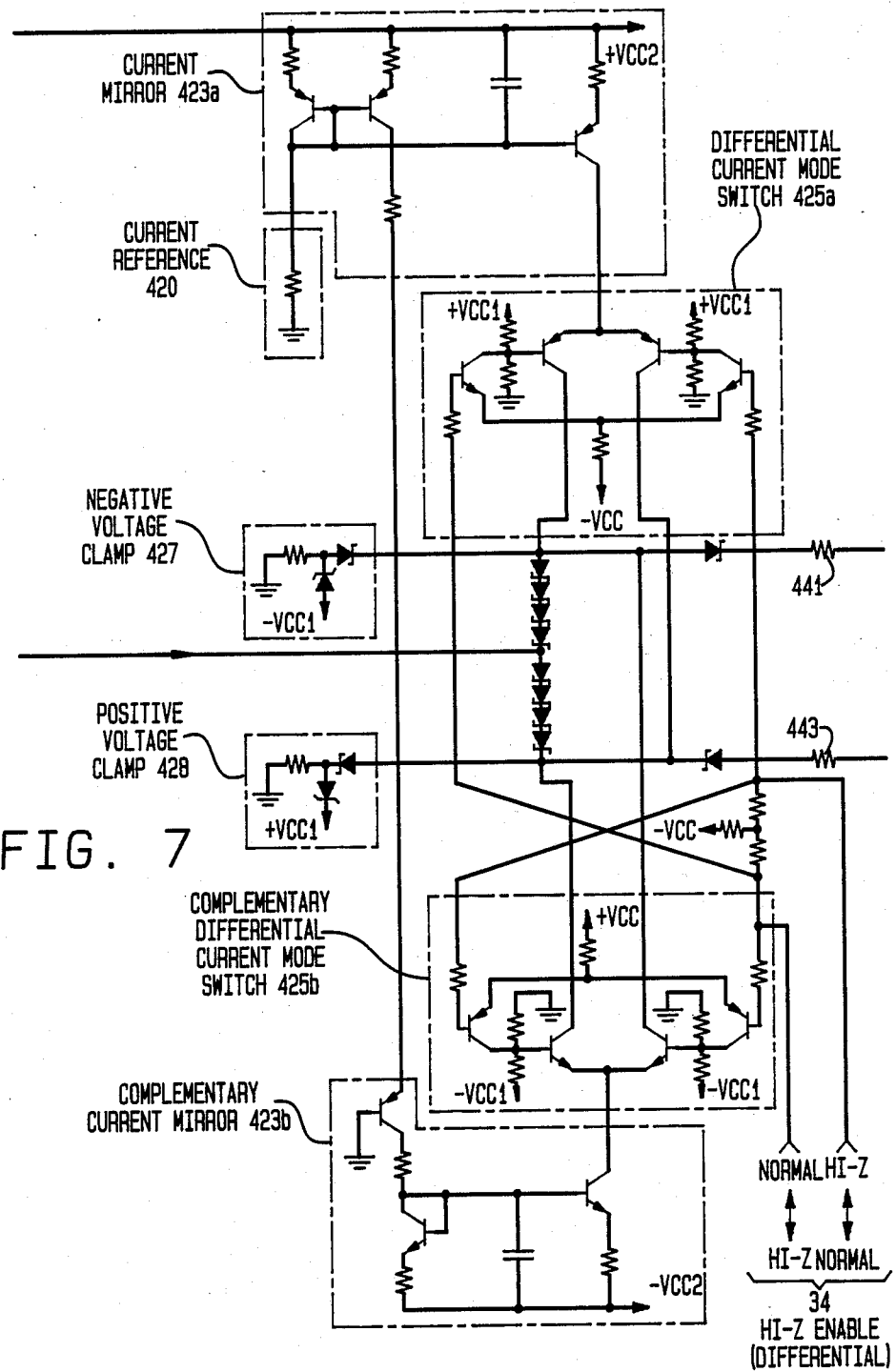

Both negative voltage clamp 427 and positive voltage clamp 428 contain Schottky and appropriate Zener diodes, as shown in greater detail in FIG. 7. Whenever bridge 430 is forward-biased, the Schottky diodes in both clamps are reverse-biased thereby electrically isolating both clamps from the bridge. As with analog multiplexor 310, Schottky diodes are used in all the signal paths because of their desirable high speed switching characteristics.

Alternatively, whenever inventive driver 30 is operated in the high impedance mode, current mode switches 425a and 425b, in response to, for example, a high level differential input signal appearing on HI-Z enable input 34, switch the bias current flowing through the top and bottom (switching) nodes of bridge 430 to voltage clamps 427 and 428, thereby activating both clamps. The voltage present at the top node of bridge 430 becomes that produced by negative voltage clamp 427. Similarly, the voltage present at the bottom node of bridge 430 becomes that produced by positive voltage clamp 428. Consequently, all the Schottky diodes comprising bridge 430 are reverse-biased (non-conductive), thereby opening the signal path between the input to the bridge appearing on lead 409 and the input to output buffer 450. In addition, both clamp voltages are such that no base current flows through output transistors 455 and 457. This, in turn, causes the emitter current flowing through these transistors to decrease to zero, thereby placing output 35 in a high impedance state. The positive and negative clamp voltages are set to be slightly higher than the maximum expected positive and negative peak amplitudes, respectively, of input analog signals appearing on inputs 31 and 33. By so doing, the values of these clamp voltages assure that bridge 430 remains reverse-biased over any analog input signal voltage lying within an expected range while preventing excess reverse bias voltage from appearing across any of the legs of this bridge.

The output transistors used in buffer 450 (e.g. transistors 455 and 457 shown in FIG. 4 and the twelve output transistors used in buffer 450 shown in FIG. 8) are protected from overload output currents by positive current limit 461 and negative current limit 463, respectively. Furthermore, these output transistors are protected from excessively sharp impulse currents by impulse current limit 465. This impulse limit circuit, as shown in detail in FIG. 8, comprises two high frequency transistors. Each transistor in this limit circuit monitors the current flowing in the first emitter lead in one half (either upper or lower) of output buffer 450 and removes an input signal from that half of the buffer whenever an overcurrent condition is detected. The value of the impulse overload current which will switch each of the transistors in impulse limit 465 "on", thereby removing an input signal from buffer 450, is set to approximately four times the value of the steady state overload current. In addition, reverse over-voltage clamp 467 -- comprised of normally reverse-biased Schottky diodes as shown in detail in FIG. 8 -- protects all the output transistors in buffer 450 from high voltages which exceed the values of the buffer supply voltages, +Vcc1 and -Vcc1, and which are inadvertently applied to output 35.

To implement the inventive driver described above, all signal paths should be DC coupled in order to permit the driver to handle arbitrary signals which may contain very low frequency components extending down to DC. Furthermore, small signal, high frequency transistors should be used in all switching and signal paths inasmuch as these transistors have inherently small values of junction capacitance and require a relatively small amount of collector bias to reach an optimum frequency response/gain operating point as compared to the collector bias required by high power RF transistors. Also, the small size and low power consumption of these transistors greatly facilitates easy hybridization.

Figure 5:
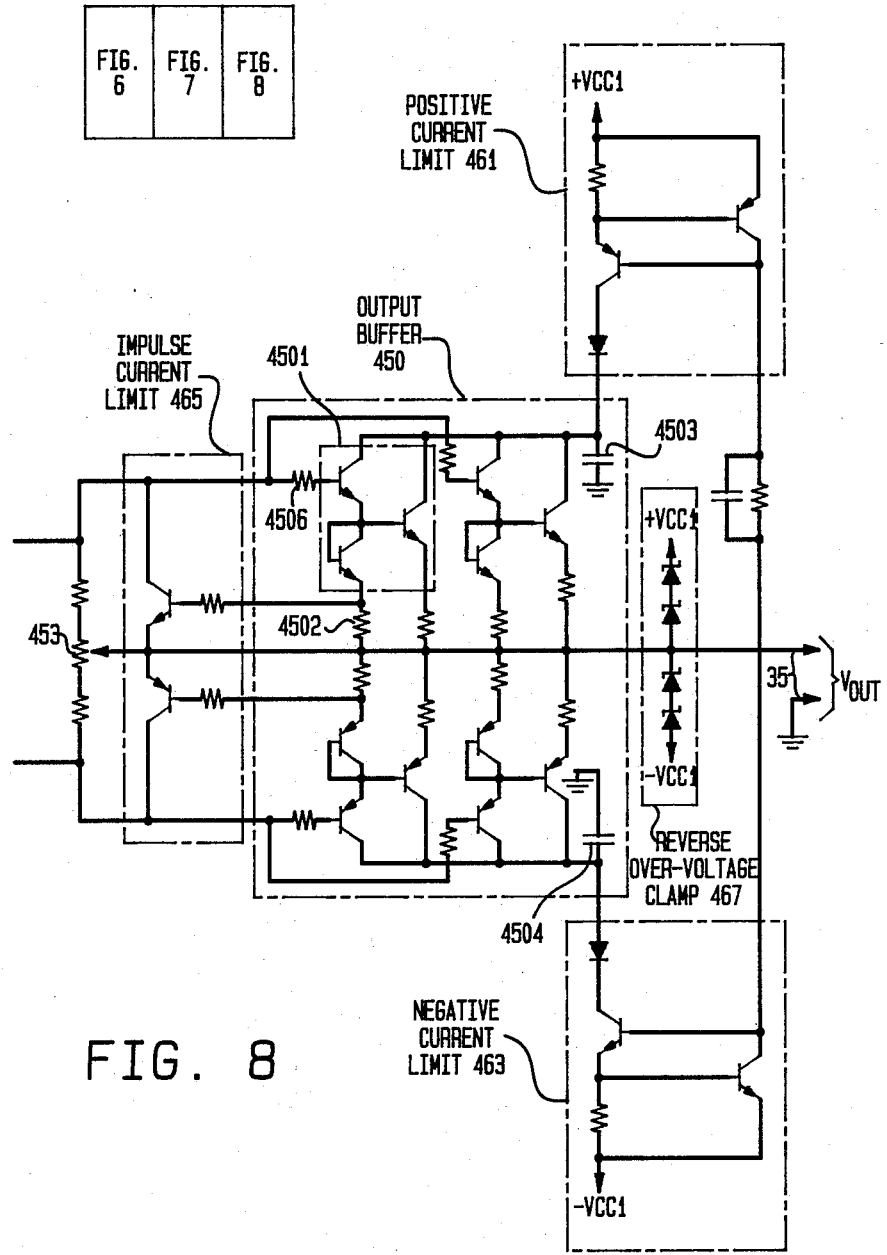
FIG. 5 shows the proper alignment of the drawing sheets for FIGS. 6–8.

A schematic of an actual driver, as constructed by the applicant and which embodies the principles of the present invention, appears in FIGS. 6-8—the proper alignment of the drawing sheets for these figures is shown in FIG. 5. The inventive driver can be fabricated using any one of many different readily available small signal transistors. Of course, the component values will depend upon the characteristics of the particular transistor selected. Hence, for the sake of simplifying this figure, component values and most by-pass capacitors have been eliminated from the figure. Nonetheless, those skilled in the art can readily select appropriate transistors, proper component values and appropriate by-pass capacitor placements.

Even though matched Schottky diodes are used to implement both Schottky diode bridges 406 and 408, in practice, some slight mis-match among these diodes will inevitably result. Consequently, whenever one of these bridges is switched "on" in order to route a high frequency analog signal (typically in excess of 20 MHz) therethrough, a slight amount of transient switching energy is "kicked out" of that bridge and back onto lead 411 or lead 413. In practice, this has been found to impart overshoot to the high frequency analog signals applied both to lead 409, and through the remainder of the driver circuitry, to driver output 35. To advantageously prevent any such overshoot from occurring, the analog amplifiers (not shown) which supply input signals V1 and V2 to inputs 31 and 33 should appear as ideal voltage sources over the useable bandwidth of the driver (e.g. DC to 200 MHz). Alternatively, if this is impractical, then, as shown, input by-pass capacitors 412 and 414 should be connected to leads 411 and 413, respectively. The lead length of these capacitors should be kept as short as possible.

The actual configuration of output buffer 450, as shown in FIG. 8, is clearly more complex than that shown in FIG. 4. As shown in FIG. 8, output buffer 450 consists of four groups (e.g. group 4501) of three interconnected non-matched NPN or PNP output transistors. A emitter resistor, e.g. resistor 4502, is intentionally inserted into each emitter lead to substantially improve stability of each group as well as current sharing between the individual non-matched output transistors comprising that group. Two such transistor groups are connected in parallel in each half of buffer 450 to provide increased output current at driver output 35. The particular well-known configuration chosen for each transistor group relies on the fact that the overall gain and cut-off frequency, ft, of each group is approximately twice that of any single transistor comprising the group. Consequently, each transistor group provides twice the output current than that available from any single transistor in that group. High frequency by-pass capacitors 4503 and 4504 also form part of the output buffer. These capacitors, which are situated very close to the individual transistor collector terminals, improve high frequency response of the entire output buffer. A small value base resistor, e.g. resistor 4506, is connected in series with the input to each transistor group to prevent any parasitic oscillations from occurring in the transistors comprising that group.

Experimental measurements show that the inventive driver depicted in FIGS. 6-8 is capable of handling digital data rates in excess of 200 mega-bits/second (MBPS) at ECL drive levels into a 50 ohm load. Furthermore, these measurements show that the analog input signal half-power (3 db) bandwidth extends from DC to 50 MHz at 10 volts peak-to-peak into a 100 ohm load. A higher voltage version of this driver possessed a 20 volt peak-to-peak output capability into the same load but at a reduced speed. Specifically, whenever the magnitudes of the supply voltages are increased, and the overall power dissipation of the driver is to remain at an essentially constant level, then the current supplied to the driver must be proportionally reduced. Consequently, as the supply current decreases, less current is available to charge the various circuit capacitances in the driver during any given time period and hence the overall switching speed of the driver decreases. Applicant believes that this driver can be miniaturized through the use of hybrid circuits to fit within a square circuit package measuring approximately 2 inches on each side and having minimal thickness.

Clearly, those skilled in the art will readily appreciate that although the inventive driver is shown with only two analog inputs, additional analog inputs can be easily accommodated. In particular, each additional analog input would require both a separate additional Schottky diode bridge (similar to bridges 406 and 408) inter-connected at its output to lead 409 and suitable current mode switches. Furthermore, inasmuch as bridge selection becomes more complex (i.e. from 1-of-2 to 1-of-3 or more), appropriate well-known combinatorial logic must be included in the driver, and be responsive to multi-bit digital signals appearing on data input 36, in order to select the desired one of the input Schottky diode bridges and appropriately control all the current mode switches connected to all these input bridges.

Although a single preferred embodiment of the inventive analog/digital driver has been shown and described herein, many other arrangements for drivers, which embody the teachings of the present invention, may be constructed by those skilled in the art without departing from the spirit and scope of the invention.

I claim:

1. A driver comprising:
   input switching means, connected to a data select signal and to a plurality of analog input signals, for selecting a desired one of said analog input signals and applying said selected analog input signal as an output signal thereof, wherein said input switching means comprises a plurality of first switching bridges each having an input node, and an output node, each of said first switching bridges being responsive at its input node to a corresponding one of said analog input signals, and the output signal of said input switching means being responsive to a signal appearing at the output node of any of said first switching bridges,
   second switching means, having a second switching bridge connected in series with the output of said input switching means, wherein said second switching means is responsive to an enable signal for either selectively causing said second switching bridge to assume a conductive state and thereby route said selected analog input signal, appearing at the output of said input switching means, through said second switching bridge as an output signal thereof or selectively assume a non-conductive state; and
   a buffer, responsive to the output of said second switching bridge, for amplifying said selected analog signal appearing at the output of said second switching bridge and applying the resulting amplified signal as an output of said driver, or alternatively causing said driver output to assume a high-impedance state whenever said second switching bridge becomes non-conductive.

2. The driver in claim 1 wherein each of said first switching bridges has at least one switching node, and said driver further comprises first switching means, responsive to said data select signal, for applying a suitable signal to the switching node of each of said first switching bridges so as to forward-bias at least a selected one of said first bridges and route the analog input signal appearing at the input node thereof through said selected bridge to the output of said input switching means.

3. The driver in claim 2 wherein the first switching means comprises a current mode switch inter-connected to a complementary current mode switch each of which is also connected to an opposite switching node of each of said first switching bridges.

4. The driver in claim 3 wherein the first switching means further comprises a current mirror, connected to said current mode switch, and a complementary current mirror, connected both to said complementary current mode switch and also to said current mirror, for supplying switching current to said current mode switch and to said complementary current mode switch, respectively.

5. The driver in claim 4 further comprising a voltage controlled current reference, responsive to the value of an appropriate analog control voltage applied to said driver and connected to said current mirror, for setting the magnitude of the switching current and thereby determining transition time of said driver output.

6. The driver in claim 2 wherein said second switching bridge has an input node connected to the output of said input switching means, at least one switching node and an output, and wherein said second switching means, comprises means, responsive to said enable signal, for applying an appropriate signal to the switching node of the second switching bridge so as to selectively forward bias said second switching bridge and thereby route said selected analog input signal therethrough to said buffer or alternatively to selectively reverse-bias said second switching bridge so as to cause the output of the driver to assume a high impedance state.

7. The driver in claim 6 wherein the second switching means comprises a second current mode switch inter-connected to a second complementary current mode switch each of which is also connected to an opposite switching node of each of said second switching bridge.

8. The driver in claim 7 wherein the second switching means further comprises a second current mirror, connected to said second current mode switch, and a second complementary current mirror, connected both to said second complementary current mode switch and also to said second current mirror, for supplying switching current to said second current mode switch and to said second complementary current mode switch, respectively.

9. The driver in claim 8 further comprising a current reference, connected to said second current mirror, for setting the magnitude of the switching current flowing in said second current mirror and in said second complementary current mirror to a value which minimizes the switching speed of said second bridge.

10. The driver in claim 1 wherein said buffer comprises:
means, responsive to output current generated by the driver, for protecting the buffer from overload output currents;
means, responsive to said output current, for protecting the buffer from excessively sharp impulse currents, and
means, responsive to the voltage appearing at the output of the driver, for protecting the buffer from high voltages applied thereto.

11. A driver comprising:
input switching means, connected to a data select signal and to a plurality of analog input signals, for selecting a desired one of said analog input signals and applying said selected analog input signal as an output signal thereof, wherein said input switching means comprises a plurality of first switching bridges each having an input node, an output node and at least one switching node, each of said first switching bridges being responsive at its input node to a corresponding one of said analog input signals, and the output signal of said input switching means being responsive to a signal appearing at the output node of any of said first switching bridges;

first switching means, responsive to said data select signal, for applying a suitable signal to the switching node of each of said first switching bridges so as to forwardbias at least a selected one of said first bridges and route the analog input signal appearing at the input node thereof through said selected bridge to the output of said input switching means;
second switching means, responsive to an enable signal, for applying an appropriate signal to the switching node of a second switching bridge so as to selectively forward or reverse bias said second switching bridge;
said second switching bridge having at least one switching node, an output and an input node connected to the output of said input switching means, and being responsive to said second switching means, for either selectively assuming a forward-biased state and thereby routing said selected analog input signal, appearing at the output of said input switching means, through said second switching bridge as an output signal thereof or selectively assuming a reverse-biased state; and
a buffer, responsive to the output of said second switching bridge, for amplifying said selected analog signal appearing at the output of said second switching bridge and applying the resulting amplified signal as an output of said driver, or alternatively causing said driver output to assume a high-impedance state whenever said second switching bridge is reverse-biased.

12. The driver in claim 11 wherein the first switching means comprises a curent mode switch inter-connected to a complementary current mode switch each of which is also connected to an opposite switching node of each of said first switching bridges.

13. The driver in claim 12 wherein the first switching means further comprises a current mirror, connected to said current mode switch, and a complementary current mirror, connected both to said complementary current mode switch and also to said current mirror, for supplying switching current to said current mode switch and to said complementary current mode switch, respectively.

14. The driver in claim 13 further comprising a voltage controlled current reference, responsive to the value of an appropriate analog control voltage applied to said driver and connected to said current mirror, for setting the magnitude of the switching current and thereby determining transition time of said driver.

15. The driver in claim 11 wherein the second switching means comprises a second current mode switch inter-connected to a second complementary current mode switch each of which is also connected to an opposite switching node of each of said second switching bridge.

16. The driver in claim 15 wherein the second switching means further comprises a second current mirror, connected to said second current mode switch, and a second complementary current mirror, connected both to said second complementary current mode switch and also to said second current mirror, for supplying switching current to said second current mode switch and to said second complementary current mode switch, respectively.

17. The driver in claim 16 further comprising a current reference, connected to said second current mirror, for setting the magnitude of the switching current flowing in said second current mirror and in said second complementary current mirror to a value which minimizes the switching speed of said second bridge.

18. The driver in claim 11 wherein said buffer comprises:
   means, responsive to output current generated by the driver, for protecting the buffer from overload output currents;
   means, responsive to said output current, for protecting the buffer from excessively sharp impulse currents, and
   means, responsive to the voltage appearing at the output of the driver, for protecting the buffer from high voltages applied thereto.

* * * * *